(12) United States Patent
Resch

(10) Patent No.: US 10,481,978 B2
(45) Date of Patent: Nov. 19, 2019

(54) OPTIMAL SLICE ENCODING STRATEGIES WITHIN A DISPERSED STORAGE UNIT

(71) Applicant: International Business Machines Corporation, Armonk, NY (US)

(72) Inventor: Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 362 days.

(21) Appl. No.: 15/402,551

(22) Filed: Jan. 10, 2017

(65) Prior Publication Data

US 2017/0286224 A1 Oct. 5, 2017

Related U.S. Application Data

(60) Provisional application No. 62/314,839, filed on Mar. 29, 2016.

(51) Int. Cl.
*G06F 11/00* (2006.01)
*G06F 11/10* (2006.01)
(Continued)

(52) U.S. Cl.
CPC .......... *G06F 11/1076* (2013.01); *G06F 3/061* (2013.01); *G06F 3/064* (2013.01); *G06F 3/0604* (2013.01); *G06F 3/067* (2013.01); *G06F 3/0619* (2013.01); *G06F 3/0631* (2013.01); *G06F 3/0635* (2013.01); *G06F 3/0644* (2013.01); *G06F 3/0647* (2013.01); *G06F 3/0653* (2013.01); *G06F 3/0659* (2013.01); *G06F 11/1092* (2013.01); *G06F 11/1662* (2013.01); *G06F 11/3684* (2013.01); *G06F 11/3688* (2013.01); *G06F 11/3692* (2013.01); *H03M 13/1515* (2013.01); *H03M 13/616* (2013.01); *H04L 67/1097* (2013.01); (Continued)

(58) Field of Classification Search
None
See application file for complete search history.

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Daniel F. McMahon
(74) *Attorney, Agent, or Firm* — Garlick & Markison; Timothy W. Markison

(57) ABSTRACT

A method for storing data in a plurality of dispersed storage units of a dispersed storage network (DSN) includes receiving an encoded data slice at a first dispersed storage unit of the DSN and determining whether to apply an additional encoding operation to the encoded data slice based on on information relating to the encoded data slice, the storage vault and an underlying memory device. The method continues with the first dispersed storage unit applying the additional encoding operation to create a modified first encoded first encoded data slice and marking the modified first encoded data slice to identify the additional encoding operation used.

18 Claims, 8 Drawing Sheets

(51) Int. Cl.
*G06F 3/06* (2006.01)
*H04L 29/08* (2006.01)
*G06F 11/36* (2006.01)
*G06F 11/16* (2006.01)
*H03M 13/15* (2006.01)
*H03M 13/00* (2006.01)
*H03M 13/37* (2006.01)

(52) U.S. Cl.
CPC .... *G06F 2201/805* (2013.01); *G06F 2201/82* (2013.01); *H03M 13/373* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 7,778,972 | B1 * | 8/2010 | Cormie .................. G06F 3/0607 707/626 |
| 8,850,013 | B2 * | 9/2014 | Waldman .............. G06F 9/5083 370/229 |
| 8,959,067 | B1 * | 2/2015 | Patiejunas ........... G06F 16/2228 707/696 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2013/0103729 | A1 * | 4/2013 | Cooney ................. G06F 16/188 707/831 |
| 2015/0169716 | A1 * | 6/2015 | Franklin ................. G06F 16/27 707/610 |
| 2016/0065498 | A1 * | 3/2016 | Harper .................. H04L 47/826 709/223 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

(56) References Cited

OTHER PUBLICATIONS

Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

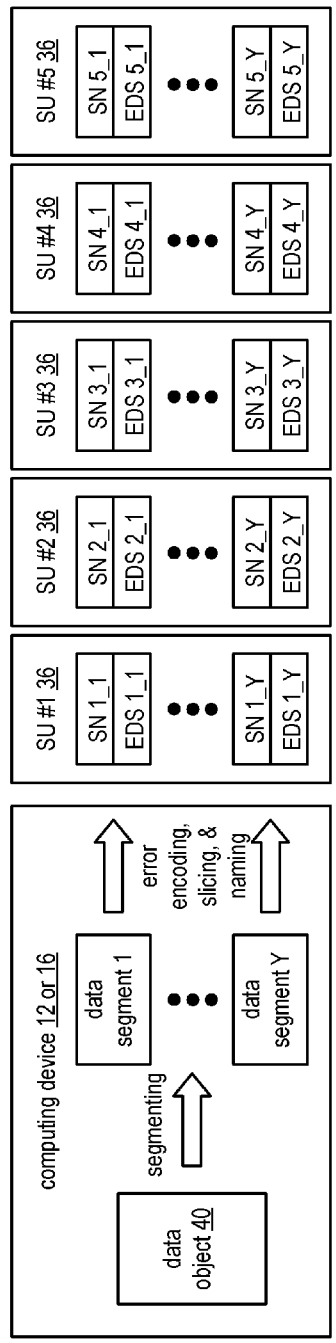
FIG. 3
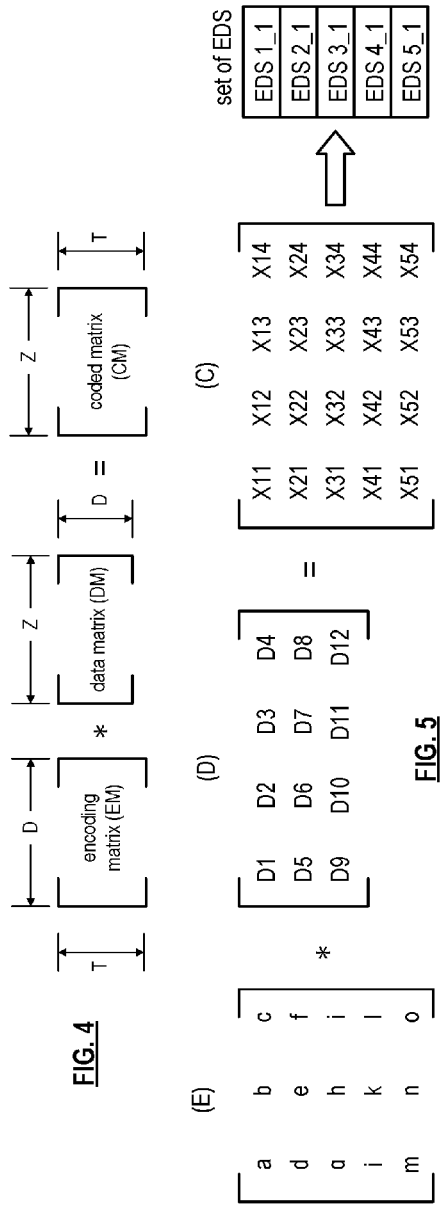
FIG. 4
FIG. 5
FIG. 6

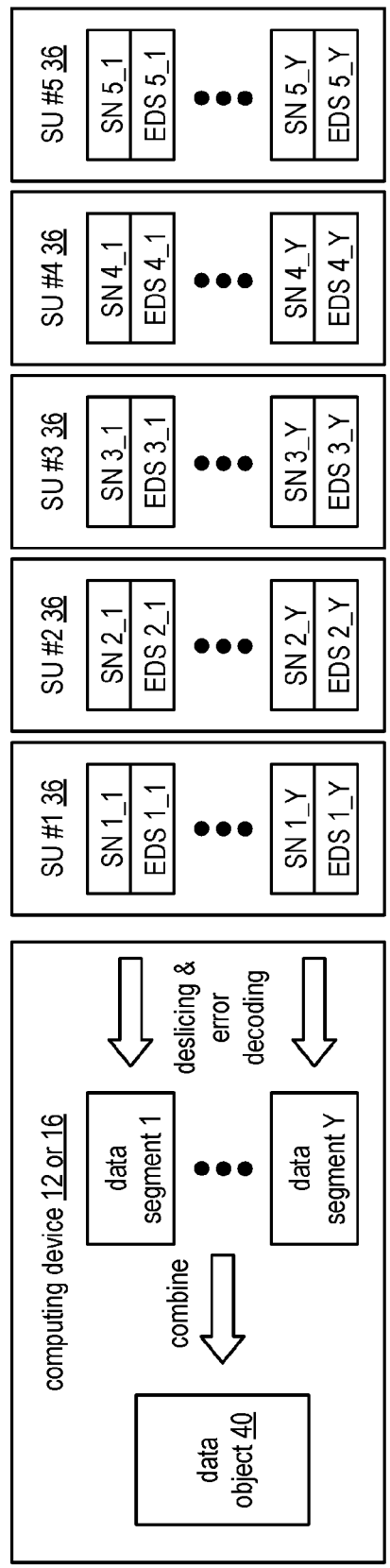

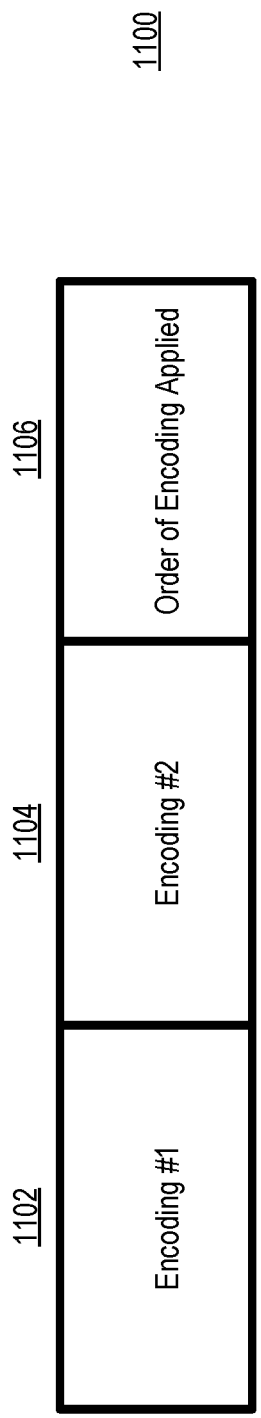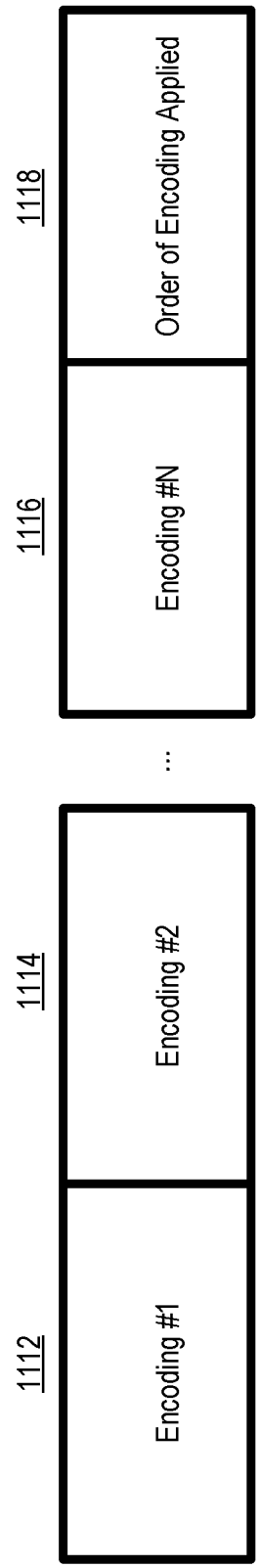

OPTIMAL SLICE ENCODING STRATEGIES WITHIN A DISPERSED STORAGE UNIT

CROSS REFERENCE TO RELATED APPLICATIONS

The present U.S. Utility Patent Application claims priority pursuant to 35 U.S.C. § 119(e) to U.S. Provisional Application No. 62/314,839, filed 29 Mar. 2016, entitled "Processing an Encoded Data Slice in a Dispersed Storage Network," which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networks, and more particularly to data encoding/decoding operations within in a dispersed storage network.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on a remote storage system. The remote storage system may include a RAID (redundant array of independent disks) system and/or a dispersed storage system that uses an error correction scheme to encode data for storage.

In a RAID system, a RAID controller adds parity data to the original data before storing it across an array of disks. The parity data is calculated from the original data such that the failure of a single disk typically will not result in the loss of the original data. While RAID systems can address certain memory device failures, these systems may suffer from effectiveness, efficiency and security issues. For instance, as more disks are added to the array, the probability of a disk failure rises, which may increase maintenance costs. When a disk fails, for example, it needs to be manually replaced before another disk(s) fails and the data stored in the RAID system is lost. To reduce the risk of data loss, data on a RAID device is often copied to one or more other RAID devices. While this may reduce the possibility of data loss, it also raises security issues since multiple copies of data may be available, thereby increasing the chances of unauthorized access. In addition, co-location of some RAID devices may result in a risk of a complete data loss in the event of a natural disaster, fire, power surge/outage, etc.

BRIEF DESCRIPTION OF THE SEVERAL VIEWS OF THE DRAWING(S)

FIG. 3 is a schematic block diagram of an example of dispersed storage error encoding of data in accordance with the present disclosure;

FIG. 4 is a schematic block diagram of a generic example of an error encoding function in accordance with the present disclosure;

FIG. 5 is a schematic block diagram of a specific example of an error encoding function in accordance with the present disclosure;

FIG. 6 is a schematic block diagram of an example of slice naming information for an encoded data slice (EDS) in accordance with the present disclosure;

FIG. 7 is a schematic block diagram of an example of dispersed storage error decoding of data in accordance with the present disclosure;

FIG. 8 is a schematic block diagram of a generic example of an error decoding function in accordance with the present disclosure;

FIG. 11A is a schematic diagram of an embodiment of marking encoded data slices; and FIG. 11B is a schematic diagram of an embodiment of marking encoded data slices.

DETAILED DESCRIPTION OF THE INVENTION

Figure 1:
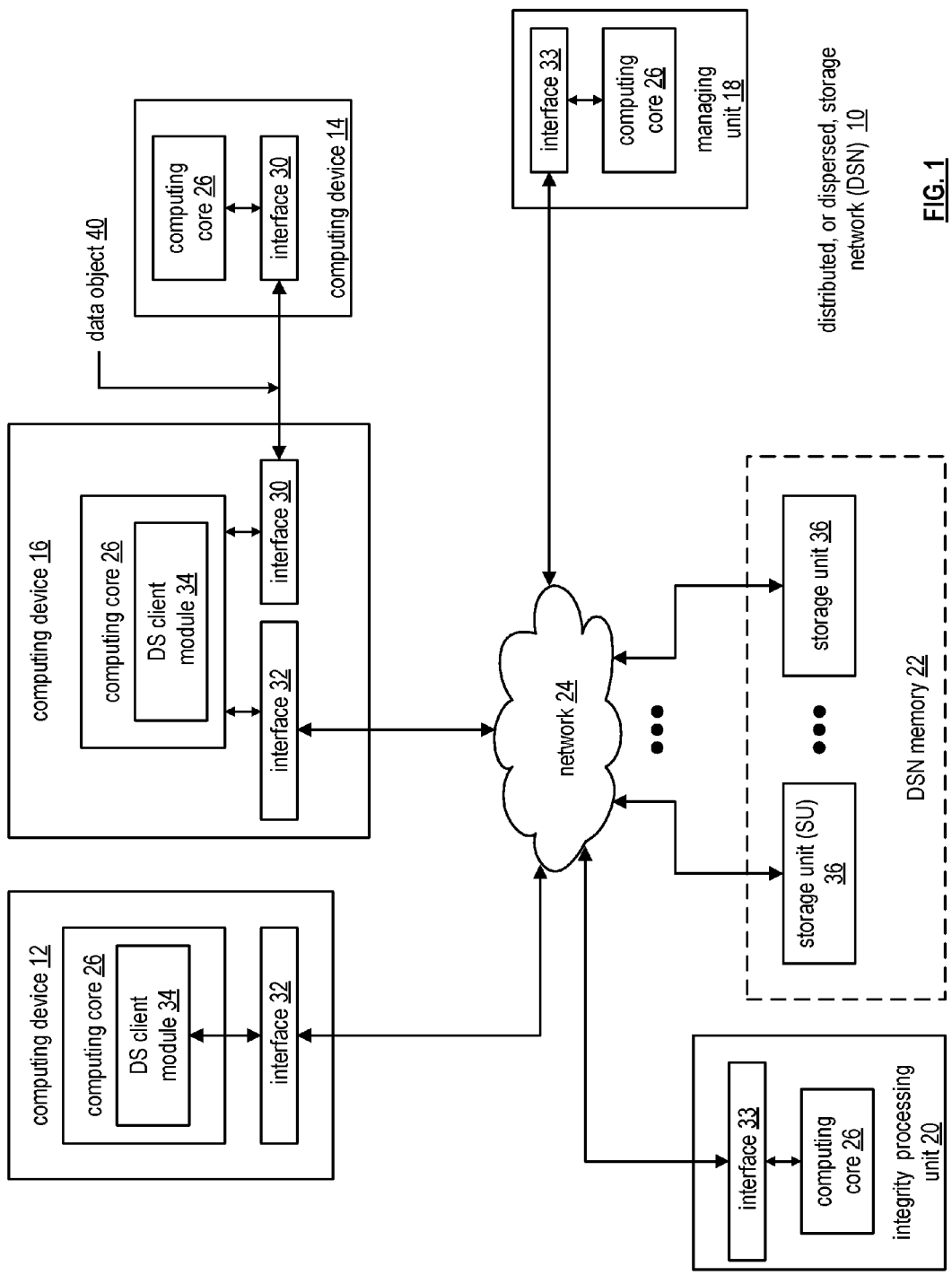
FIG. 1 is a schematic block diagram of an embodiment of a dispersed, or distributed, storage network (DSN) in accordance with the present disclosure.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36.

Each of the computing devices 12-16, the managing unit 18, and the integrity processing unit 20 include a computing core 26, and network interfaces 30-33 which can be part of or external to computing core 26. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data object 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-16 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20. The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate per-access billing information. In another instance, the managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

To support data storage integrity verification within the DSN 10, the integrity processing unit 20 (and/or other devices in the DSN 10) may perform rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. Retrieved encoded slices are checked for errors due to data corruption, outdated versioning, etc. If a slice includes an error, it is flagged as a 'bad' or 'corrupt' slice. Encoded data slices that are not received and/or not listed may be flagged as missing slices. Bad and/or missing slices may be subsequently rebuilt using other retrieved encoded data slices that are deemed to be good slices in order to produce rebuilt slices. A multi-stage decoding process may be employed in certain circumstances to recover data even when the number of valid encoded data slices of a set of encoded data slices is less than a relevant decode threshold number. The rebuilt slices may then be written to DSN memory 22. Note that the integrity processing unit 20 may be a separate unit as shown, included in DSN memory 22, included in the computing device 16, and/or distributed among the storage units 36.

Figure 2:
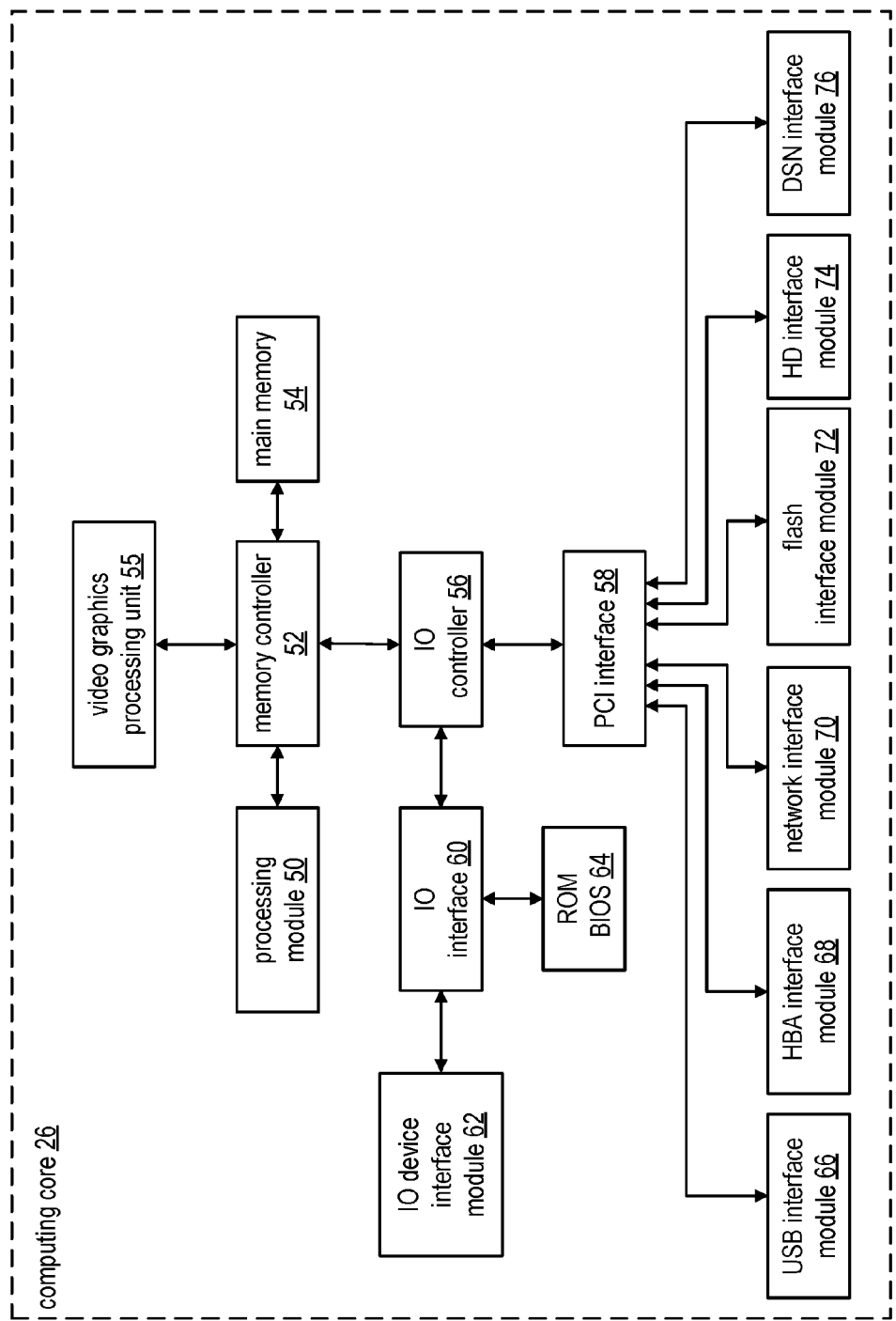
FIG. 2 is a schematic block diagram of an embodiment of a computing core in accordance with the present disclosure.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number. In the illustrated example, the value X11=aD1+bD5+cD9, X12=aD2+bD6+cD10, . . . X53=mD3+nD7+oD11, and X54=mD4+nD8+oD12.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as at least part of a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

In order to recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
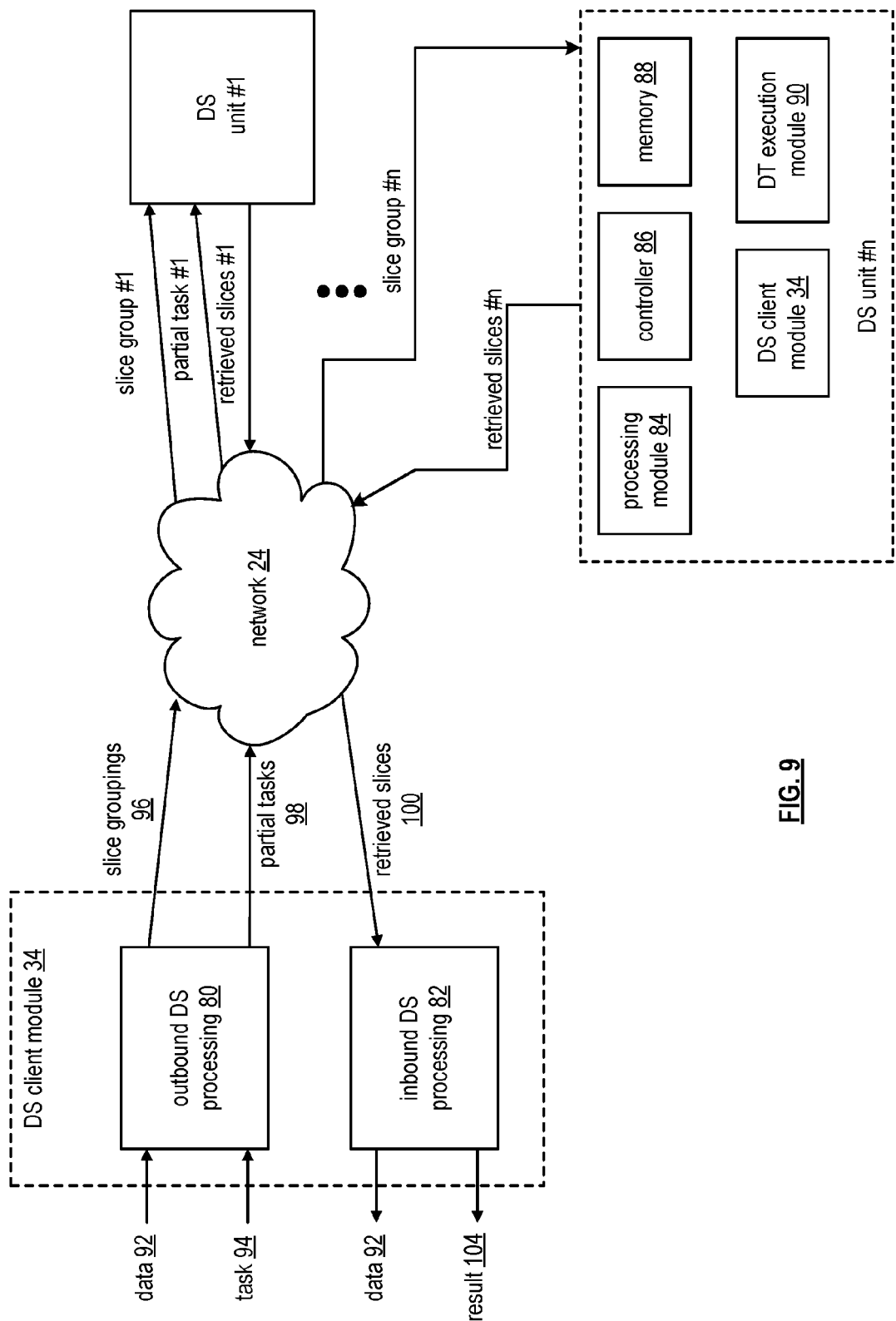
FIG. 9 is a schematic block diagram of an example of a dispersed storage network in accordance with the present disclosure.

FIG. 9 is a diagram of an example of a dispersed storage network. The dispersed storage network includes a DS (dispersed storage) client module 34 (which may be in computing devices 12, 14 and/or 16 of FIG. 1), a network 24, and a plurality of DS units 1-n that includes two or more storage units 36 of FIG. 1 (which form at least a portion of DS memory 22 of FIG. 1), a DSN managing unit (not shown—device 18 in FIG. 1), and a DS integrity verification module (not shown—device 20 in FIG. 1). The DS client module 34 includes an outbound DS processing section 80 and an inbound DS processing section 82. Each of the DS units 1-n includes a controller 86, a processing module 84, memory 88, a DT (distributed task) execution module 90, and a DS client module 34.

In an example of operation, the DS client module 34 receives data 92. The data 92 may be of any size and of any content, where, due to the size (e.g., greater than a few Terabytes), the content (e.g., secure data, etc.), and/or concerns over security and loss of data, distributed storage of the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes). Within the DS client module 34, the outbound DS processing section 80 receives the data 92. The outbound DS processing section 80 processes the data 92 to produce slice groupings 96. As an example of such processing, the outbound DS processing section 80 partitions the data 92 into a plurality of data partitions. For each data partition, the outbound DS processing section 80 dispersed storage (DS) error encodes the data partition to produce encoded data slices and groups the encoded data slices into a slice grouping 96.

The outbound DS processing section 80 then sends, via the network 24, the slice groupings 96 to the DS units 1-n of the DSN memory 22 of FIG. 1. For example, the outbound DS processing section 80 sends slice group to DS storage unit 1. As another example, the outbound DS processing section 80 sends slice group #n to DS unit #n.

In one example of operation, the DS client module 34 requests retrieval of stored data within the memory of the DS units 36. In this example, the task 94 is retrieve data stored in the DSN memory 22. Accordingly, and according to one embodiment, the outbound DST processing section 80 converts the task 94 into a plurality of partial tasks 98 and sends the partial tasks 98 to the respective DS storage units 1-n.

In response to the partial task 98 of retrieving stored data, a DS storage unit 36 identifies the corresponding encoded data slices 100 and retrieves them. For example, DS unit #1 receives partial task #1 and retrieves, in response thereto, retrieved slices #1. The DS units 36 send their respective retrieved slices 100 to the inbound DST processing section 82 via the network 24.

The inbound DS processing section 82 converts the retrieved slices 100 into data 92. For example, the inbound DS processing section 82 de-groups the retrieved slices 100 to produce encoded slices per data partition. The inbound DS processing section 82 then DS error decodes the encoded slices per data partition to produce data partitions. The inbound DS processing section 82 de-partitions the data partitions to recapture the data 92.

The storage units or DS units of FIG. 9 may be used to determine whether to apply addition encoding to a data slice when storing data, which encodings and their order are marked on the data slice, which marking is then used during decoding when the data slice is read from memory. Further explanations of this process are set out below in conjunction with FIGS. 10A and 10B.

Figure 10A:
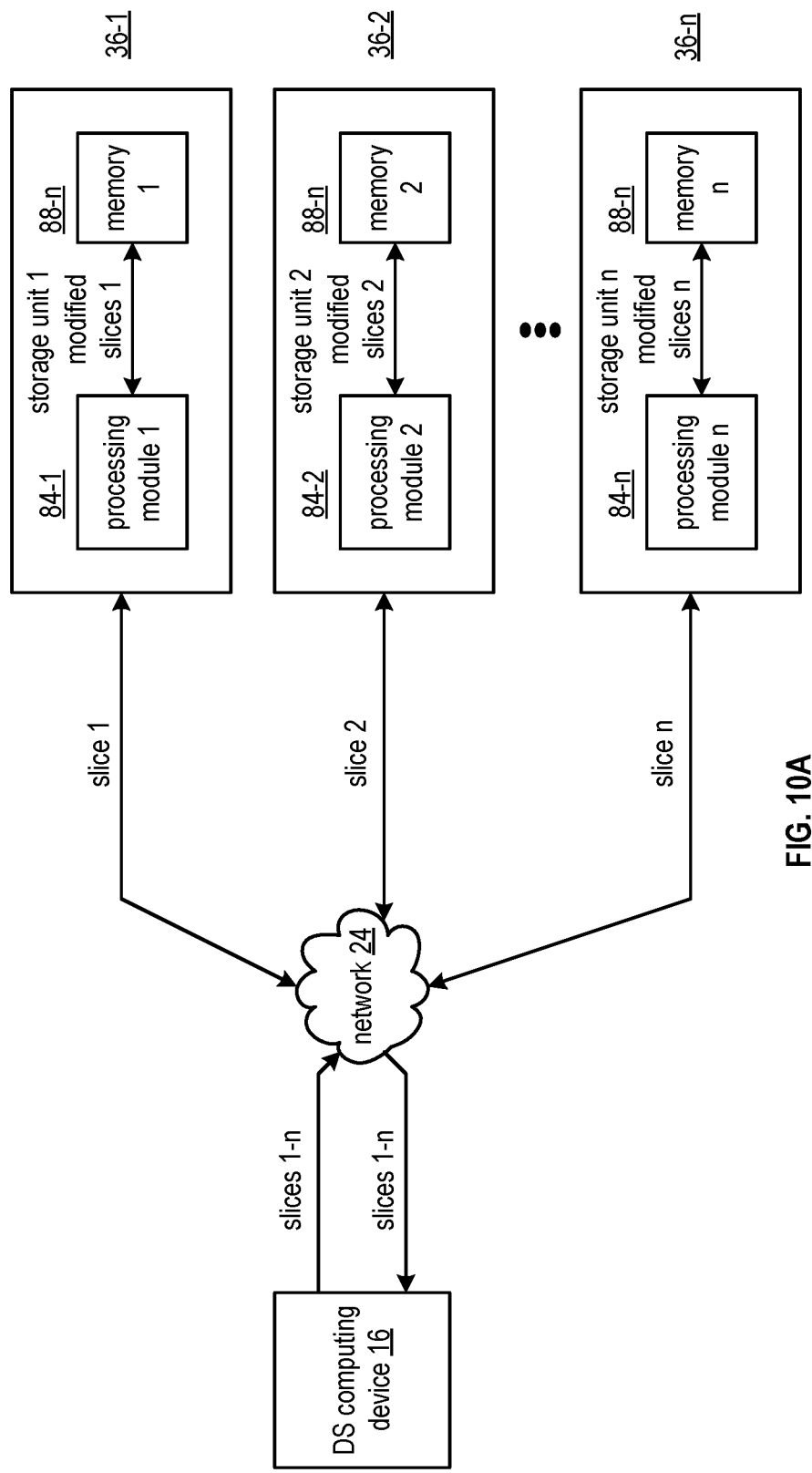
FIG. 10A is a schematic diagram of another embodiment of a dispersed storage network in accordance with the present disclosure.

FIG. 10A is a schematic block diagram of another embodiment of a dispersed storage network that includes the computing device 16 of FIG. 1, the network 24 of FIG. 1, and a set of storage units 1-n (36-1, 36-2, . . . , 36-n). Each storage unit includes a processing module (84-1, 84-2, . . . , 84-n) and at least one memory (88-1, 88-2, . . . , 88-n). The processing module may be implemented utilizing the processing module 84 of FIG. 9. Each memory may be implemented utilizing the memory 88 of FIG. 9. Each storage unit may be implemented utilizing the DS unit 36 of FIG. 9. Hereafter, each storage unit 36 may be interchangeably referred to as a DS unit and the set of storage units may be interchangeably referred to as a set of DS units. The DSN functions to process an encoded data slice.

In an example of operation of the processing of the encoded data slice, when receiving an encoded data slice for storage, for each encoding algorithm of a plurality of the encoding algorithms, a storage unit determines whether to apply the encoding algorithm to the encoded data slice. The encoding algorithms includes one or more of a compression algorithm, an encryption algorithm, a metadata extraction algorithm, etc. The determining may be based on one or more of a vault identifier (ID), a requesting entity ID, a data type indicator, a data size indicator, a slice name, an analysis of the encoded data slice, a local memory type indicator, a level of available processing resources, and a level of available storage resources. For example, the processing module 1 (84-1) receives, via the network 24, a slice 1 from the computing device 16 for storage in storage unit 1 (36-1), and determines to apply the compression algorithm and the encryption algorithm when the analysis of encoded data slice indicates that the slice 1 is compressible with an expected efficiency benefit and that the slice 1 has not been encrypted.

Having determined to apply one or more encoding algorithms, the storage unit 1 (36-1), for each encoding algorithm to be applied to the encoded data slice, using processing module 1 (84-1) performs the encoding algorithm the encoded data slice and an interim result of performing another encoding algorithm to produce a modified encoded data slice. The performing may include determining a sequence of performing each encoding algorithm based on one or more of a predetermination, an interpretation of system registry information, and indicator received from a requesting entity, and a level of available processing resources, and executing each encoding algorithm in accordance with the determine sequence to produce the modified encoded data slice.

Having performed the one or more encoding algorithms, the storage unit facilitates storage of the modified encoded data slice and marking the slice with a record of encoding algorithm is applied (e.g., including the order in accordance with the sequence of the performing of each encoding algorithm). The facilitating includes storing the modified encoded data slice in the record in a local memory. For example, the processing module 1 (84-1) stores the modified encoded data slice 1 in the memory 1 (88-1) of the storage unit 1 (36-1). An example of storing encoding and ordering of encodings applied to an encoded data slice are shown in FIGS. 11A and 11B. As shown in FIG. 11A, an indication of a first encoding is shown as 1102 and an indication of a second encoding is shown as 1104. An indication of the ordering is then shown at 1106. A person of skill in the art will recognize that the ordering 1106 could be implicit if a convention is used such that the order in which encoding was applied matches the order in which encodings are indicated in 1100. Similarly, no ordering indication would be required if only one encoding was applied. A more generalized version of such marking scheme is shown in 1110 to address the case where there are N encodings applied.

When retrieving a stored modified encoded data slice, the storage unit retrieves the corresponding record of the encoding algorithm applied and the corresponding sequence of performing from the local memory. For each encoding algorithm applied, the storage unit applies a corresponding reverse encoding algorithm in a reverse order based on the record of the encoding algorithms applied and the sequence in which they were applied to reproduce the encoded data slice. For example, the processing module 1 recovers the modified encoded data slice 1 from the memory 1, decrypts the recovered modified encoded data slice 1 to produce an interim result, and decompresses the interim result to reproduce the encoded data slice 1. Having reproduced the encoded data slice, the storage unit sends the reproduced encoded data slice to the computing device 16. For example, the processing module 1 (84-1) and sends, via the network 24, the reproduced encoded data slice 1 to the computing device 16.

Figure 10B:
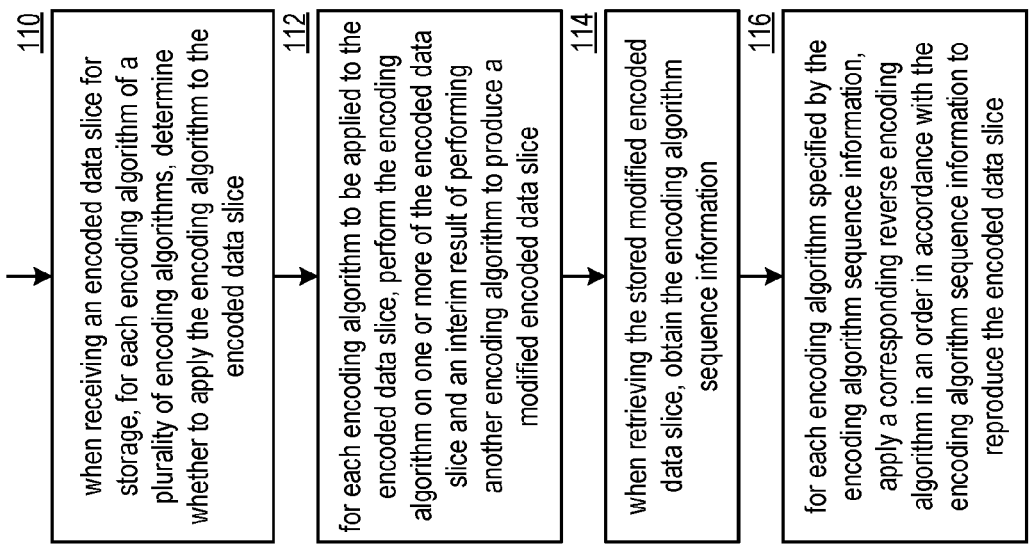
FIG. 10B is a schematic diagram of another embodiment of a dispersed storage network in accordance with the present disclosure.

FIG. 10B is a flowchart illustrating an example of processing an encoded data slice. The method includes a step 110 where a processing module (84) (e.g., of a storage unit (36)), when receiving an encoded data slice for storage, for each encoding algorithm of a plurality of encoding algorithms, determines whether to apply the encoding algorithm to the encoded data slice. The determining may be based on one or more of a vault identifier, a requesting entity identifier, a data Indicator, a data size indicator, a slice name, and analysis of encoded data slice (i.e., as to whether a corresponding encoding algorithm has already been performed), a local memory type indicator, a level of available processing resources, and a level of available storage resources.

For each encoding algorithm to be applied to the encoded data slice, the method continues at the step 112 where the processing module (84) performs the encoding algorithm on one or more of the encoded data slice and an interim result of performing another encoding algorithm to produce a modified encoded data slice. The performing includes determining encoding algorithm sequence information that includes a sequence of performing each encoding algorithm based on one or more of a predetermination, an interpretation of system registry information, an indicator received from a requesting entity, and the level of available processing resources. The performing further includes executing each encoding algorithm in accordance with the encoding algorithm sequence information to produce the modified encoded data slice and storing the modified encoded data slice and/or the encoding algorithms applied and encoding sequence information (as in FIGS. 11A and 11B) in a local memory (88).

When retrieving the stored modified encoded data slice, the method continues at the step 114 where the processing module obtains the encoding algorithm sequence information associated with the stored modified encoded data slice. For example, the processing module (84) recovers the encoded data slice and the encoding algorithm slice information from the local memory (88).

For each encoding algorithm specified by the encoding algorithm sequence information, the method continues at the step 116 where the processing module (84) applies a corresponding reverse encoding algorithm in an order in accordance with the encoding algorithm sequence information to reproduce the encoded data slice. The applying includes identifying each corresponding reverse encoding algorithm (e.g., decrypting for encrypting, decompressing for compressing, etc.), determining the reverse order of execution of the reverse encoding algorithms based on the encoding algorithm sequence information (e.g., backwards), and executing a reverse encoding algorithms in the determined reverse order to reproduce the encoded data slice.

The methods described above in conjunction with the computing device and the storage units can alternatively be performed by other modules of the dispersed storage network or by other devices. For example, any combination of a first module, a second module, a third module, a fourth module, etc. of the computing device and the storage units may perform the method described above. In addition, at least one memory section (e.g., a first memory section, a second memory section, a third memory section, a fourth memory section, a fifth memory section, a sixth memory section, etc. of a non-transitory computer readable storage medium) that stores operational instructions can, when executed by one or more processing modules of one or more computing devices and/or by the storage units of the dispersed storage network (DSN), cause the one or more computing devices and/or the storage units to perform any or all of the method steps described above.

As may be used herein, the terms "substantially" and "approximately" provides an industry-accepted tolerance for its corresponding term and/or relativity between items. Such an industry-accepted tolerance ranges from less than one percent to fifty percent. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from Figure to Figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information. A computer readable memory/storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for storing data in a dispersed storage network, the dispersed storage network including a plurality of dispersed storage units comprising:
receiving a first encoded data slice at a first dispersed storage unit of the plurality of dispersed storage units;
determining, by the first dispersed storage unit, whether to apply a first additional encoding operation to the first encoded data slice, wherein the determining is based on information relating to at least one of the first encoded data slice, a vault, or an underlying memory device, and
applying the first additional encoding operation to create a modified first encoded data slice, wherein the applying the first additional encoding operation includes marking the modified first encoded data slice with information sufficient to identify the first additional encoding operation.

2. The method of claim 1 wherein the information relating to at least one of the first encoded data slice, a vault or an underlying memory device includes at least one of a vault ID, a requesting entity ID, a data type indicator, a data size indicator, the first encoded data slice name, an analysis of the first encoded data slice, a local memory type indicator, a level of available processing resources.

3. The method of claim 1 wherein the first additional encoding operation includes at least one of compression encoding, encryption encoding and data slice meta data encoding.

4. The method of claim 1 further including:
determining by the first dispersed storage unit whether to apply a second additional encoding operation to the modified first encoded data slice;
in response to a determination to apply the second additional encoding operation to the modified first encoded data slice, applying the second additional encoding operation to the modified first encoded data slice to create a twice modified first encoded data slice; and
marking the twice modified first encoded data slice with information sufficient to identify the second additional encoding operation and information sufficient to identify an order in which the first additional encoding operation and second additional encoding operation were applied.

5. The method of claim 4 wherein the determining whether to apply the second additional encoding operation to the modified first encoded data slice is further based on information regarding the first additional encoding operation applied to the first encoded data slice.

6. The method of claim 1 wherein determining by the first dispersed storage unit whether to apply the first additional encoding operation to the first encoded data slice includes determining whether to apply compression coding based on storage gains for the first dispersed storage unit and CPU cycle costs to the first dispersed storage unit.

7. The method of claim 1 wherein determining by the first dispersed storage unit whether to apply the first additional encoding operation to the first encoded data slice includes determining whether to apply encryption encoding based on whether or not the first encoded data slice is already encrypted.

8. The method of claim 1 wherein determining by the first dispersed storage unit whether to apply the first additional encoding operation to the first encoded data slice includes determining whether to apply meta-data encoding based on whether meta-data is already stored for the data slice in the first dispersed storage unit.

9. The method of claim 4 further including
storing the twice modified first encoded data slice in the first dispersed storage unit;
receiving a request to read the twice modified first encoded data slice from the first dispersed storage unit; and
in response to the request, decoding the first additional encoding and second additional encoding based on the first additional encoding operation applied to the first encoded data slice and second additional encoding operation applied to the modified first encoded data slice and based on the order in which the first additional encoding operation and second additional encoding operation were applied.

10. A first dispersed storage unit for storing data in a dispersed storage network, the dispersed storage network including a plurality of dispersed storage units, the first dispersed storage unit comprising:
an communications interface;
a memory; and
a computer processor;
where the memory includes instructions for causing the processor to:
receive a first encoded data slice at a first dispersed storage unit of the plurality of dispersed storage units;
determine whether to apply a first additional encoding operation to the first encoded data slice, wherein the determining is based on information relating to at least one of the first encoded data slice, a vault, or an underlying memory device, and
apply the first additional encoding operation to create a modified first encoded data slice, wherein the applying the first additional encoding operation includes marking the modified first encoded data slice with information sufficient to identify the first additional encoding operation.

11. The first dispersed storage unit of claim 10 wherein the information relating to at least one of the first encoded data slice, a vault or an underlying memory device includes at least one of a vault ID, a requesting entity ID, a data type indicator, a data size indicator, the first encoded data slice name, an analysis of the first encoded data slice, a local memory type indicator, a level of available processing resources.

12. The first dispersed storage unit of claim 10 wherein the first additional encoding operation includes at least one of compression encoding, encryption encoding and data slice meta data encoding.

13. The first dispersed storage unit of claim 10 further including instructions for causing the processor to:
   determine by the first dispersed storage unit whether to apply a second additional encoding operation to the modified first encoded data slice;
   in response to a determination to apply the second additional encoding operation to the modified first encoded data slice, apply the second additional encoding operation to the modified first encoded data slice create a twice modified first encoded data slice; and
   mark the twice modified first encoded data slice with information sufficient to identify the second additional encoding operation and information sufficient to identify an order in which the first additional encoding operation and second additional encoding operation were applied.

14. The first dispersed storage unit of claim 13 wherein instructions for causing the processor to determine whether to apply the second additional encoding operation to the modified first encoded data slice includes instructions regarding the first additional encoding operation applied to the first encoded data slice.

15. The first dispersed storage unit of claim 12 wherein instructions for causing the processor to determine whether to apply the first additional encoding operation to the first encoded data slice includes instructions for causing the processor to determine whether to apply compression coding based on storage gains for the first dispersed storage unit and CPU cycle costs for the first dispersed storage unit.

16. The first dispersed storage unit of claim 10 wherein instructions for causing the processor to determine whether to apply the first additional encoding operation to the first encoded data slice includes instructions for causing the processor to determine whether to apply encryption encoding based on whether or not the first encoded data slice is already encrypted.

17. The first dispersed storage unit of claim 10 wherein instructions for causing the processor to determine whether to apply the first additional encoding operation to the first encoded data slice includes instructions for causing the processor to determine whether to apply meta-data encoding based on whether meta-data is already stored for the data slice in the first dispersed storage unit.

18. The first dispersed storage unit of claim 13 further including instructions for causing the processor to:
   store the twice modified first encoded data slice in the memory;
   receive a request via the interface to read the twice modified first encoded data slice from the memory; and
   in response to the request, decode the twice modified first encoded data slice based on the first additional encoding operation applied to the first encoded data slice and second additional encoding operation applied to the modified first encoded data slice and based on the order in which the first additional encoding operation and second additional encoding operation were applied.

* * * * *